（12）United States Patent
Nakasuji

(10) Patent No.: US 8,809,799 B2
(45) Date of Patent: Aug. 19, 2014

(54) CHARGED PARTICLES BEAM APPARATUS AND CHARGED PARTICLES BEAM APPARATUS DESIGN METHOD

(71) Applicant: Mamoru Nakasuji, Yokohama (JP)

(72) Inventor: Mamoru Nakasuji, Yokohama (JP)

(73) Assignees: Mamoru Nakasusi, Yokohamashi (JP); Katsuto Goto, Tokyo (JP)

( * ) Notice: Subject to any disclaimer, the term of this patent is extended or adjusted under 35 U.S.C. 154(b) by 0 days.

(21) Appl. No.: 13/573,696

(22) Filed: Oct. 4, 2012

(65) Prior Publication Data

US 2014/0097352 A1 Apr. 10, 2014

(51) Int. Cl.
*H01J 23/08* (2006.01)
*H01J 37/04* (2006.01)

(52) U.S. Cl.
USPC ................. 250/396 R; 250/492.3; 250/493.1; 250/310; 315/5.31

(58) Field of Classification Search
USPC ........... 250/396 R, 493.1, 492.3; 315/111.81, 315/5.31
See application file for complete search history.

(56) References Cited

U.S. PATENT DOCUMENTS 6,218,676 B1 * 4/2001 Nakasuji .................... 250/492.3
6,326,633 B2 * 12/2001 Nakasuji .................... 250/492.3
7,741,601 B2 * 6/2010 Noji et al. ...................... 250/310

* cited by examiner

*Primary Examiner* — Nikita Wells

(57) ABSTRACT

Problems to be solved: To obtain higher brightness than Langmuir limit. Adjust brightness to the optimum value.
Method of resolution: To obtain such beams, the following means and methods are effective. A charged particles beam apparatus consisting of a charged particle source, a beam drawing electrode, and a beam control electrode, wherein; after the charged particles beam source a condenser lens is designed, and brightness of the charged particles beam is adjusted by adjusting a magnification factor of said condenser lens.

20 Claims, 14 Drawing Sheets

CHARGED PARTICLES BEAM APPARATUS AND CHARGED PARTICLES BEAM APPARATUS DESIGN METHOD

FIELD OF INVENTION

This invention pertains to a charged particles beam apparatus which gives very high brightness characteristics. This invention also pertains to a charged particles beam apparatus with a charged particles source. The apparatus include a defect detection apparatus which detect defects on a semiconductor wafers by irradiating an charged particles beam to a finely patterned wafer, detecting SE signal from the patterns, and forming image data.

BACKGROUND OF INVENTION

The semiconductor manufacturing process is the era of 45 nm design rule. The production form is shifting from the small item mass production represented by DRAM to the multi item small production like SOC (Silicon on chip). According to this, the number of manufacturing process is increasing, improvement in yield in every process is essential, and an inspection of a defect which is generated in the process become very important.

According to the higher integration of a semiconductor device and the finer patterning, an inspection system of high resolution and high throughput is required. In order to check a defect on a wafer substrate of 45 nm design rule, it is necessary to inspect a pattern defect in the pattern having the line width of 40 nm and less, and further to inspect a defect of a particle. Further, it is necessary to check the electrical defect thereof. According to an increase in the manufacturing process accompanying the higher integration of a device, the amount of inspection is increased. A higher throughput is accordingly required. Further, tendency toward multilayer of a device is accelerated, an inspection system is required to have a function of detecting a contact failure (electrical defect) of a via connecting wire between layers.

Further, the electron gun for an ERL radiation optical source is required a very high brightness and large beam current. (Nishitani et al, Extended Abstracts (The 53rd Spring Meeting, 2006); The Japanese Society of Applied Physics No. 2, p 798). A heavy ion source for a heavy ion radiotherapy is also required a very small Emittance beam.

Seventy four years ago, Langmuir showed that the current density in a focused beam of cathode rays was shown to have an upper limit defined by $$J = J_c (e\phi/kT_c + 1)\sin^2 \alpha, \quad (1)$$

where J was the maximum current density obtainable in the focused spot, $J_c$ was the current density at the cathode, $\phi$ was the voltage at the focus relative to the cathode, e was the electronic charge, k was Boltzmann's constant, $\alpha$ was the half angle subtended by the cone of electrons which converged on the focused spot and $T_c$ was the absolute temperature of the cathode. The necessary initial assumptions were (1) that electrons leaved the cathode with a Maxwellian distribution of velocities, and (2) that the focusing system was free from aberration and obeyed the law of sines.

By using Liouville's theorem instead of the assumption (2), J. R. Pierce defined the same results as the eq. (1). As a result it is seen to be independent of the nature of the concentrating system when only steady fields are involved.

From the equation (1) to obtain the high brightness, the large cathode current density is absolutely necessary, and then a field emission gun and a Schottky cathode electron gun are much used as the high brightness electron gun than the thermal cathode electron gun. As thus the limit has been played a very important part in developments for the high brightness electron gun.

SUMMARY OF THE INVENTION

It is a purpose of this invention to obtain the charged particles apparatus with high brightness beams. To obtain such beams, the following means and methods are claimed.

1. A charged particles beam apparatus consisting of a charged particle source, a beam drawing electrode, and a beam control electrode, wherein;
    after the charged particles beam source a condenser lens is designed, and brightness of the charged particles beam is adjusted by adjusting a magnification factor of said condenser lens.

By this charged particles beam, the optimum brightness can be used.

2. In the former charged particles beam apparatus, wherein, said magnification factor of said condenser lens is infinite.

By this charged particles beam apparatus, the maximum brightness can be used.

3. The charged particles beam apparatus in the means 1, wherein,
    said magnification factor is adjusted by the image position of the condenser lens.

By this charged particles beam apparatus, the brightness can be adjusted to the optimum value without changing the lens position of the first stage lens.

4. The charged particles beam apparatus of the means 1, wherein,
    The lens position is larger than 41 mm.
    From this means the brightness depend on the lens magnification factor.

5. The charged particles beam apparatus of the means 1, wherein,
    further comprising a second condenser lens,
    and the lens position of the second condenser lens is smaller than 40 mm.
    From this means the brightness which is formed by the first stage lens is not depend on the second stage lens.

6. A charged particles beam apparatus consisting of a charged particle source, a beam drawing electrode, a beam control electrode, and a condenser lens wherein;
    after the charged particles beam source a condenser lens is designed, and an Emittance of the charged particles beam is adjusted by adjusting a magnification factor of the condenser lens.

By this means the Emittance can be adjusted. Especially when the magnification of the condenser lens is smaller than 1, a large Emittance can be obtained.

7. A charged particles beam apparatus design method comprising steps,
    after the charged particles beam source a condenser lens is deposited the optimum brightness is estimated,
    The brightness is adjusted to said optimum brightness, by adjusting a magnification factor of said condenser lens.

The optimum brightness can be used by this design method.

8. The charged particles beam apparatus design method in the former method,
    said optimum brightness is estimated by aberrations of the lens system, a space charge effect or diffraction and required beam characteristics.

On one side the aberrations are increasing function of NA, on the other hand the space charge effect and the diffraction blur is decreasing function of NA, and therefore there is optimum NA. As a result there is the optimum brightness.

9. The charged particles beam apparatus design method in the method 7, a said beam characteristic is a beam size.

A large beam current with an optimum beam size can be obtained.

10. The charged particles beam apparatus design method in the means 7, a said beam characteristic is a beam diversion angle.

A very small diameter beam with a very small beam diversion angle can be obtained.

11. The charged particles beam apparatus design method in the means 7, further comprising a step The brightness as a function of the image position of the condenser lens is simulated.

By this method, the relation between the brightness and the image position become clear.

From this means, the distance between the first lens and the second lens can be designed 12. The charged particles beam apparatus design method in claim 7, further comprising a step, the second and $3^{rd}$ lens are designed, and the lens position of the second or the $3^{rd}$ lens is smaller than 40 mm.

By this method, the high brightness formed by the first stage lens is kept at the target.

13. The charged particles beam apparatus of claim 6, wherein, said magnification factor of the condenser lens is smaller than 1.

A large Emittance beam can be obtained by this means.

14. The charged particles beam apparatus of claim 1, wherein, further comprising a second and third condenser lenses, a first parallel beam is formed by said first lens, and the second parallel beam is formed by said third condenser lens, and wherein the second parallel beam size is smaller than the first parallel beam.

A very small Emittance beam can be obtained by this means.

15. The charged particles beam apparatus of claim 1, wherein, said optimum brightness is estimated from the Emittance.

In the case where the relations between the brightness and the Emittance are known and the optimum Emittance is known, the optimum brightness can be obtain easily.

16. The charged particles beam apparatus design method in the means 7, said optimum brightness is estimated from an experience.

The case where the optimum brightness is known, the optimum design can be done easily.

17. The charged particles beam apparatus of claim 1, further comprising, an aperture is deposited back of the anode and removes the peripheral beam.

By this means a very small energy width beam with high brightness can be obtained.

18. The charged particles beam apparatus of claim 1, wherein said magnification factor is larger than 1.

By this invention, the higher brightness than Langmuir limit can be obtained.

19. The charged particles beam apparatus of means 1, wherein said charged particles beam is a heavy ion.

The heavy ion beam with very small diverging angle and very fine diameter can be obtained by this means.

20. The charged particles beam apparatus of means 1, wherein said charged particles beam source have a spherical electrode and a spherical mesh electrode.

By this means the charged particles beam, whose current density at the ion source is small and the current density at the crossover, is very large can be obtained.

DETAILED DESCRIPTION OF A PREFERRED EMBODIMENT

Figure 1:
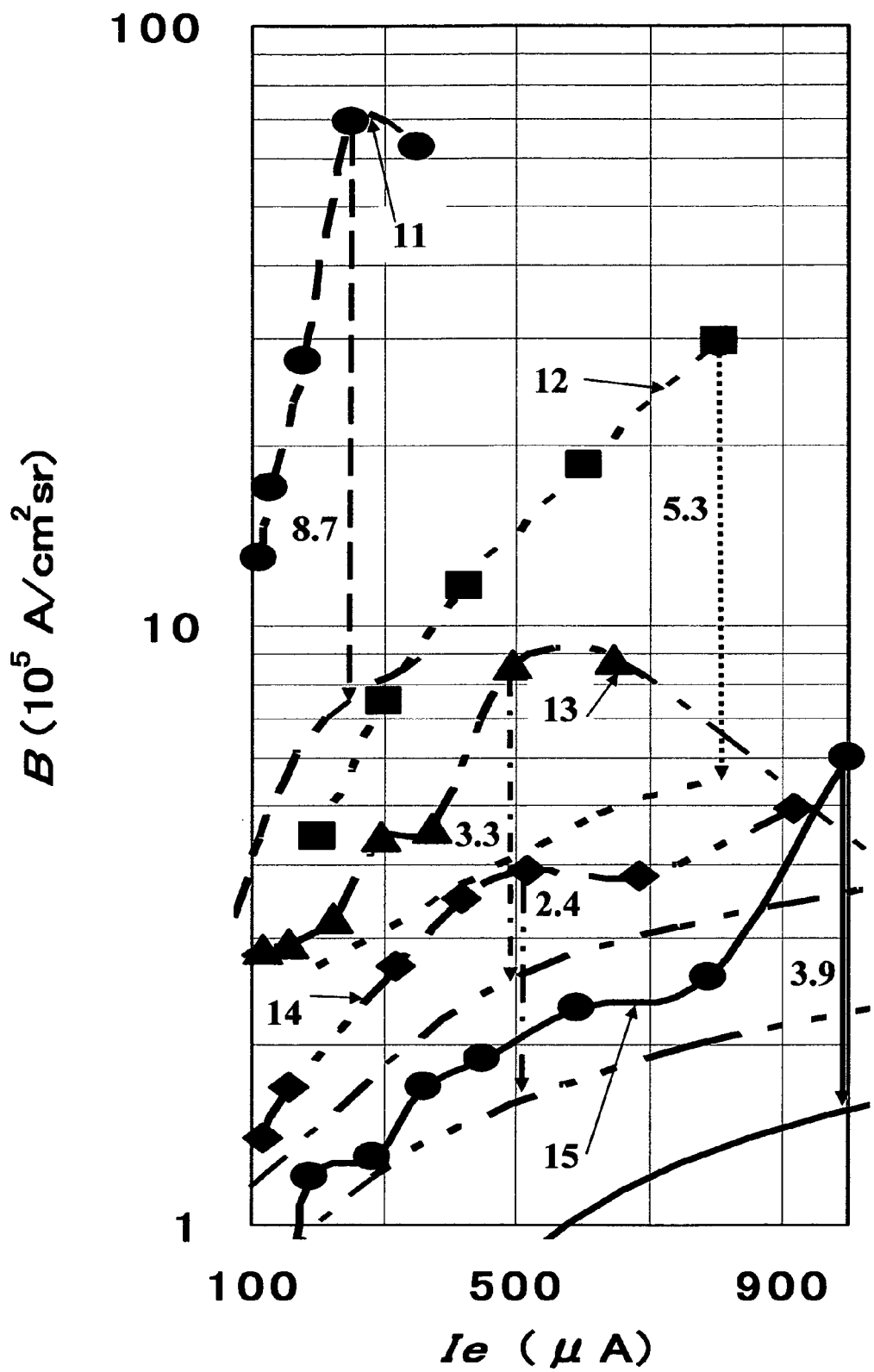
FIG. 1 Experimental brightness as a function of the emission current, here Langmuir limit which are calculated using simulated axial cathode current density are added in the same type line's curves without mark. Each maximum separation ratio between the measured brightness and the simulated Langmuir limit for the same emission current is shown with an arrow.

Inventor showed an experimental brightness exceeded simulated Langmuir limit. FIG. 1 shows the experimental brightness as a function of the emission current, here Langmuir limit which are calculated using the simulated cathode current density are added in the same type line's curves. The cathode is 90 degree cone shape and its apex is a sphere shape, the cathode material, a crystal orientation, its work function, its beam energy and its temperature are $LaB_6$, (100), 2.65 eV, 20 keV and 1900 K, respectively, and a wehnelt electrode is a flat shape with 1.6 mm diameter hole. Broken: 11, dotted: 12, broken with a dot: 13, broken with double dots: 14 and solid: 15 curves are the brightness for the cathode apex radius of curvatures for the 20, 60, 120, 240, and 480 μm, respectively. The curves with marks are the experimental brightness and the ones without mark are the simulated Langmuir limit. The maximum separations between the experimental brightness and Langmuir limit for the same emission current are calculated, and added in this figure with arrows. The each experimental brightness for the cathode apex radius of curvature of the 20, 60, 120, 240, and 480 μm is 8.7, 5.3, 3.3, 2.4 and 3.9 times higher brightness than each Langmuir limit, respectively. For the entire cathode and the emission current, the measured brightness is higher than Langmuir limit. These experimental data are too old to be believed against the theory of Langmuir limit, and then some simulations and the brightness measurements are done.

A brightness calculation model is formed as the electron guns with the $LaB_6$ cathodes and a magnetic lens, for the comparison between the simulation and the old measured brightness, where the cathode apex radius of curvature: Rcc are the 20, 60, 120, 240, and 480 μm.

Figure 2:
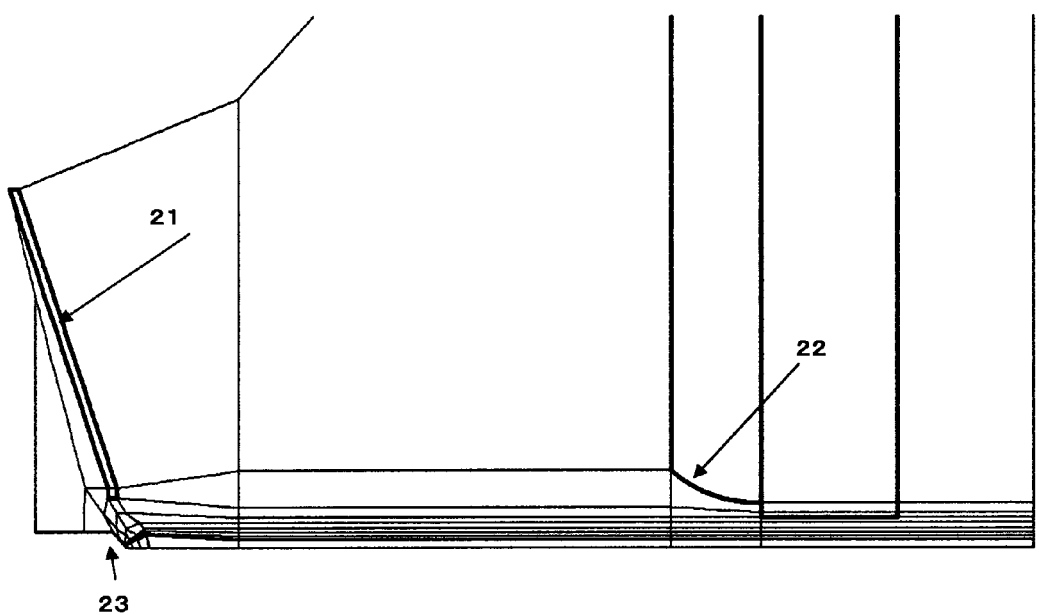
FIG. 2 Electron gun model for this experiment. The cathode is 90 degree cone shape and its apex is 30 μm radius sphere shape, a wehnelt electrode is concave cone shape with 2 mm diameter hole and a cone semi-angle is 70 degrees, and the cathode to an anode distance is 12 mm.

FIG. 2 is an example of the electron gun with the 60 μm apex radius of curvature cathode. Where 21 is a wehnelt electrode, 22 is an anode and 23 is a cathode, respectively. The magnetic lens is a popular lens with a lens gap of 2 mm and a bore radius of 5 mm, and the magnetic field is formed in the z-coordinate from −90 mm to 50 mm. The cathode temperature is the 1900 K and the beam energy is the 20 keV. The lens position or a distance between the beam source and the lens principal plane: a, the image position or the distance between the lens principal plane and the image: b, the beam energy, and a magnetic lens field are given to a commercially available software: ABER-5, and the lens excitation satisfying the image position: b is calculated, where the lens position: a is the 180 mm from the cathode. By using these lens excitations and the electron gun data shown in Table-1, the brightness are calculated. In this model mesh sizes around a cathode surface are particularly finer than the other area from the cathode to the target. Distances from the cathode to an anode, from the cathode to the wehnelt, and from the cathode to the target are 7.5, 0.2 and 25 mm, respectively. The simulation is done by use of a commercially available computer program: SOURCE-version1.5. Emittance are also calculated, as a product of a $\phi_{co}$ and a $\theta_{90}$, where the $\phi_{co}$ is the crossover diameter and the $\theta_{90}$ is defined as an emission angle that the brightness is 90% of the axial brightness.

Figure 3:
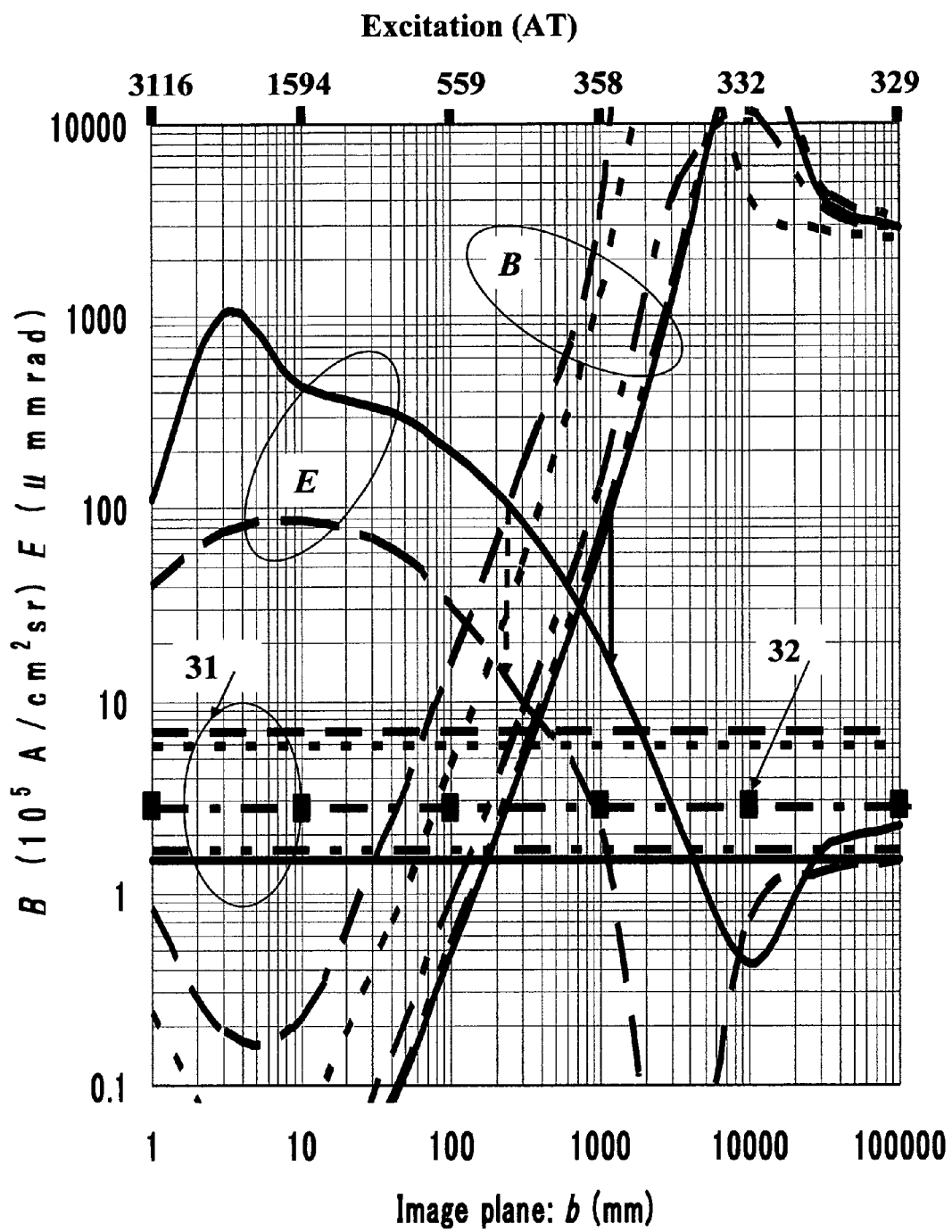
FIG. 3 Simulated brightness: B, Emittance: E, and Langmuir limit as a function the image position. Rectangular marks are the brightness for the cathode apex radius of curvature of the 120 μm and the lens position: a of 40 mm or less.

FIG. 3 is the simulated axial brightness as a function of the image position: b. Where 31 is Langmuir limit and 32 is a simulated brightness for the cathode curvature of 120 μm Rcc and the lens position of 40 mm. The lens excitations giving each image position: b is shown in a top of the figure. For each emission current which gives the maximum separation, between the experimental brightness and simulated Langmuir limit, the simulation is done. For each the cathode apex radius of curvature: Rcc of the 20, 60, 120, 240 and 480 μm, the emission current is 251, 813, 490, 514, and 999 μA, respectively, as seen from the arrow's coordinate in FIG. 1. Each brightness and Langmuir limit is calculated for the cathode apex radius of curvature and the emission current.

Increasing curves, decreasing curves and flat lines for the image position: b of from 10 to 1000 mm, are the brightness, Emittance and Langmuir limit, respectively. The simulated results for the Rcc of the 20, 60, 120, 240, and 480 μm are shown by the broken, dotted, broken with a dot, broken with double dots, and solid line curves, respectively. Rectangle marks are the simulated brightness for the Rcc of the 120 μm cathode and the lens position: a of 40 mm or less.

As seen in FIG. 3, the simulated brightness change drastically, when the lens excitation is valid. This result is inconsistent with the familiar law for ordinary optical instruments that the brightness of source of light cannot be changed by any focusing process.

The simulated brightness is nearly proportional to a square of the image position: b, for at least from 40 mm to the 1000 mm of b. When the cathode apex radius of curvature are the 120, 240 and 480 μm, the brightness are nearly equal to Langmuir limit at the image position b are 180 mm, which is equal to the lens position: a. When the cathode apex radius of curvature are the 20 and 60 μm, the brightness are equal to Langmuir limit at the image position b of 68 and 120 mm, which are smaller than the lens position of the 180 mm.

Emittance are also calculated and shown for the cathode apex radius of curvature of the and 480 μm Rcc which give the maximum and minimum axial cathode current density, respectively. The Emittance is a decreasing function of the image position b, when the brightness is the increasing function of the b, and it is the increasing function of the b, when the brightness is the decreasing function of the b. The each Emittance has the maximum and minimum values at the image position where the brightness has the minimum and maximum values, respectively.

For example, the brightness is lower than a $1 \times 10^7$ A/cm$^2$sr, the Emittance is higher than 13 μmmrad for the 20 μm Rcc cathode and higher than 17 μmmrad for the 480 μm Rcc cathode. From this simulation it may be necessary that an acceptance of the measurement system is lower than the 13 μmmrad for the brightness measurement lower than the $1 \times 10^7$ A/cm$^2$sr.

When the lens position: a is smaller than 40 mm and the cathode apex radius of curvature is the 120 μm, the simulated brightness is independent on the image position: b and nearly equal to the simulated Langmuir limit, as shown by the square marks in FIG. 3. When the cathode is the Schottky emission cathode, similar results are obtained, however, the lens position: a in which the simulated brightness does not depend on the image position is smaller than 49 mm or less.

The brightness measurements are done using an electron beam lithography system: EBW-7500C made in ELIONIX INC. The measurements are done for the electron gun with the (100) orientation $LaB_6$ cathode. The lithography system has been designed for the Schottky cathode electron gun, and have three problems for the $LaB_6$ electron gun, (1) that the maximum heating power for the cathode is 1.9 Ampere at first and too small for the $LaB_6$ cathode, (2) that the maximum emission current is limited below 190 μA, and (3) that the excitation of the second lens is programmed so that the image position of the second lens: c is 18 mm for a lens position of 60 mm, and then the minimum focus length is 13.85 mm. The heating power problem is resolved during the experiment.

Figure 4:
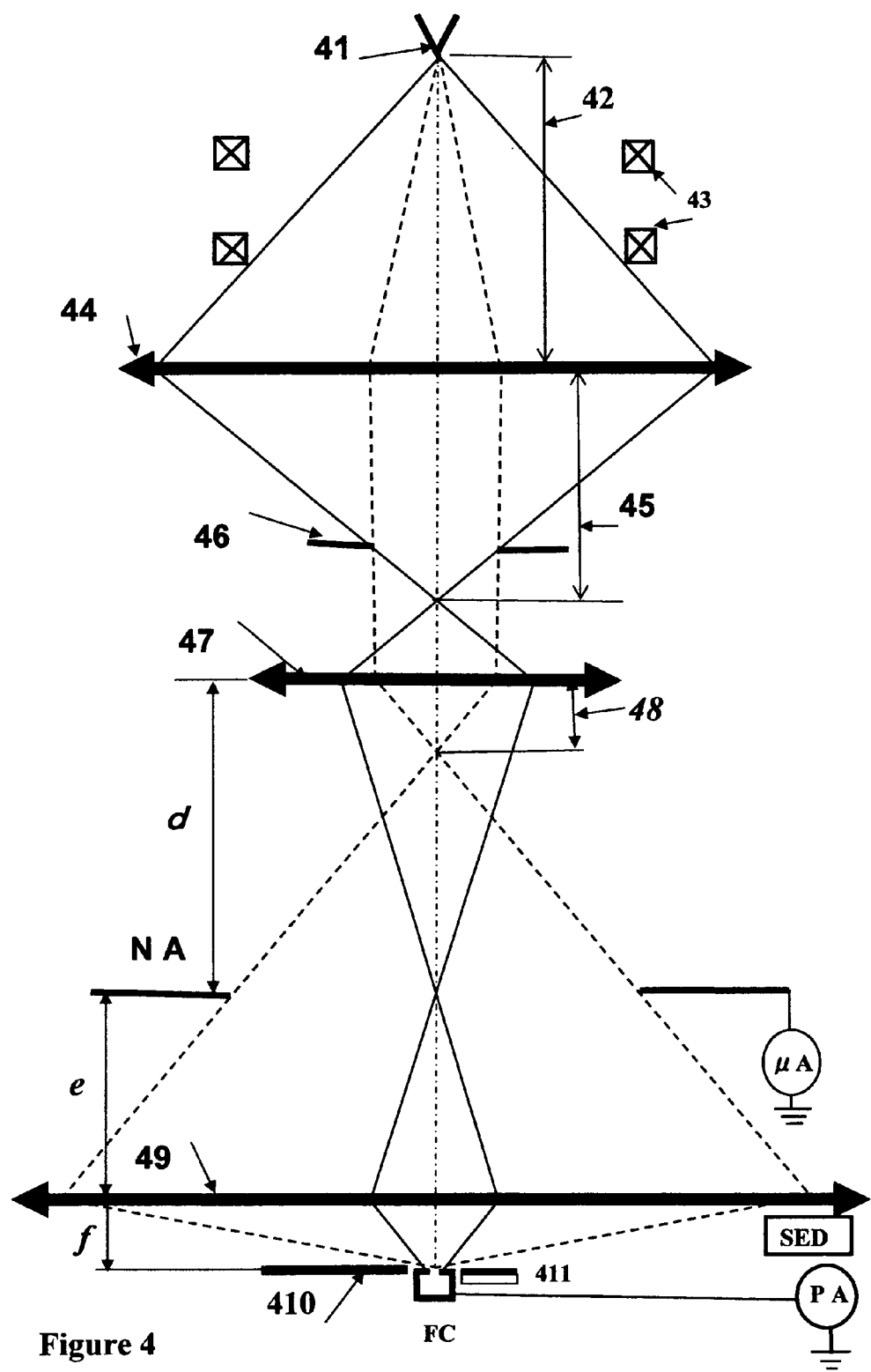
FIG. 4. Electron optics for the brightness measurement. The broken lines are the parallel beam, and the solid lines are Koehler illumination conditions. On the target there are Faraday cage with a Pico ammeter and a gold plated Si edge.
Figure 5:
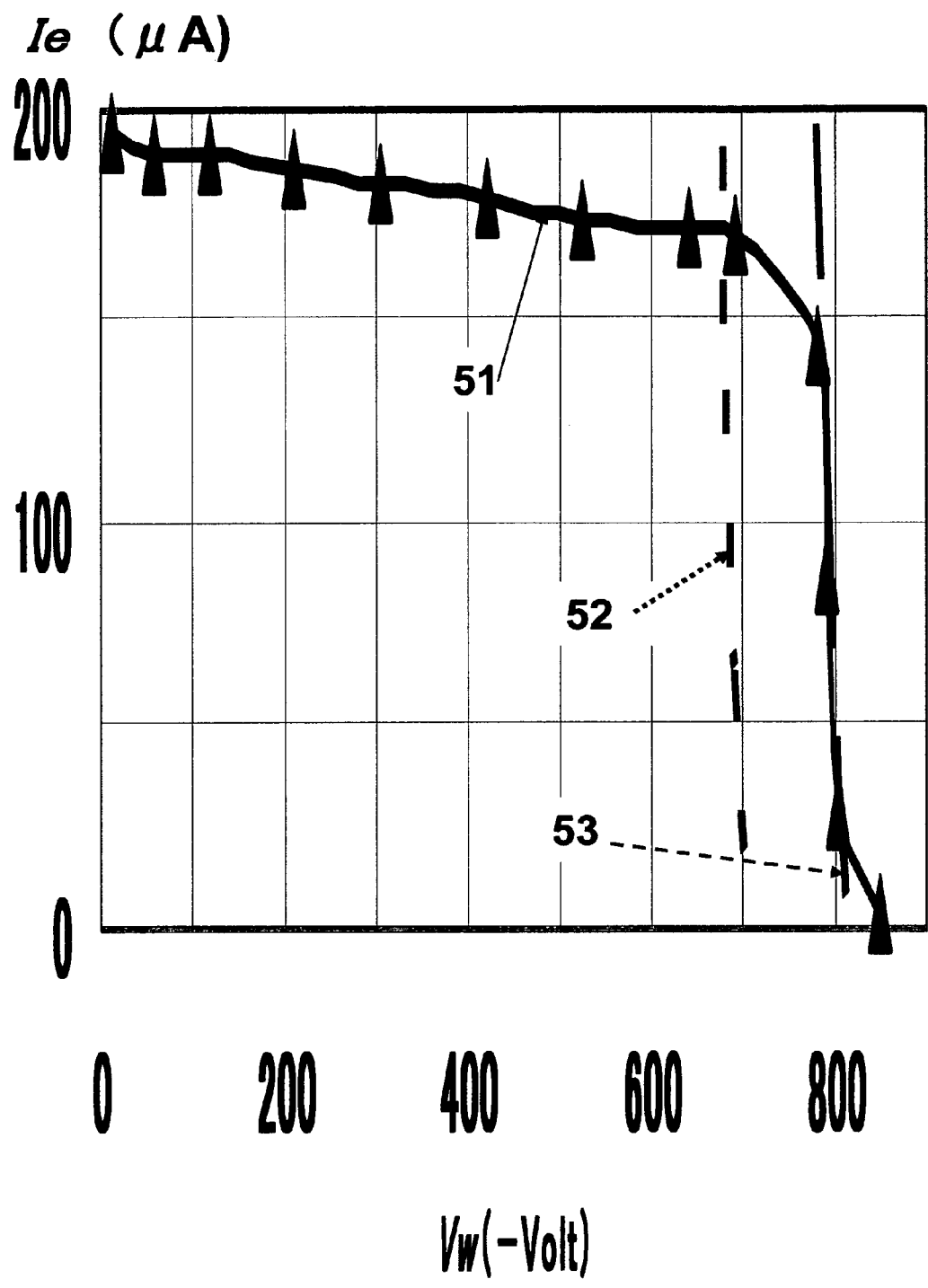
FIG. 5. Emission current as a function of the wehnelt voltage, where the solid curve with marks is the measured emission current, the broken and dotted curves are the simulated emission current for the wehnelt position of the −0.2 and −0.1 mm, respectively.

FIG. 4 is an electron optics for the EBW-7500C. Where 41 is the cathode, 42 is the lens position of the first lens: 44, 43 is a lens alignment deflector, 45 is the image position for the first lens, 46 is a blanking aperture, 47 is the second condenser lens, 48 is the image position of the second lens, 49 is the objective lens, 410 is a target and 411 is a gold plated Si edge. The experiment is done for two lens conditions, those are (1)

that the electron beam diverged from the electron gun is focused by the first lens and become the parallel beam and the crossover image is reduced by a second lens and by an objective lens, as shown by the broken lines in FIG. 4, and (2) Koehler illumination system that the diverged beam from the electron gun is converged by the first lens and focused at a designed position before the second lens and the crossover image is magnified by the second lens and focuses on a NA aperture. A shaped beam formed by a blanking aperture is reduced by the second and the objective lenses and focused on the target. This optical figure is shown by the solid lines in FIG. 5. The lens position: a is 123 mm, and the minimum image position of the second lens: c is the 13.85 mm. The blanking aperture and the NA aperture diameters are changeable to 30, 60, or 500 μm, and 40, 80 or 160 μm, respectively.

For the lens condition of (1), three measurements are done for the same emission current condition with three beam semi-angle: α conditions to increase reliability for the measured brightness, where the NA aperture diameter: $d_{NA}$ and the image position of the second lens: c are varied. The beam energy is 10 keV and the beam current is measured by a Faraday cage on the target. The beam diameter $\phi_b$ is defined to be the distance between the readings corresponding to 10% and 90% of the SE integrated intensity distribution during the scanning at the edge of the gold plating silicon edge. The measured beam current, the measured beam diameter and the measured brightness with these set up conditions are listed in Table-II. The beam semi angle α and the brightness B are calculated as in the eq. (2) and (3), respectively, $$\alpha = d_{NA}(d+e \cdot c)/2f(d \cdot c) \quad (2)$$

$$B = 4I_b/(\pi \phi_b \alpha)^2, \quad (3)$$

where the d, e, and f are 157, 167 and 37 mm, respectively.

TABLE II

Set up conditions and the measured brightness: B

| No. | dNA (μm) | c (mm) | a (mrad) | $I_b$ (nA) | $\phi_b$ (nm) | B (A/cm²sr) | Acceptance (μ mmrad) |
|---|---|---|---|---|---|---|---|
| 1 | 40 | 13.85 | 1.17 | 0.44 | 243 | 2.21 × 0⁵ | 0.284 |
| 2 | 80 | 13.85 | 2.34 | 1.64 | 252 | 1.91 × 0⁵ | 0.589 |
| 3 | 40 | 40 | 1.31 | 1.08 | 313 | 2.6 × 10⁵ | 0.41 |

Figure 6:
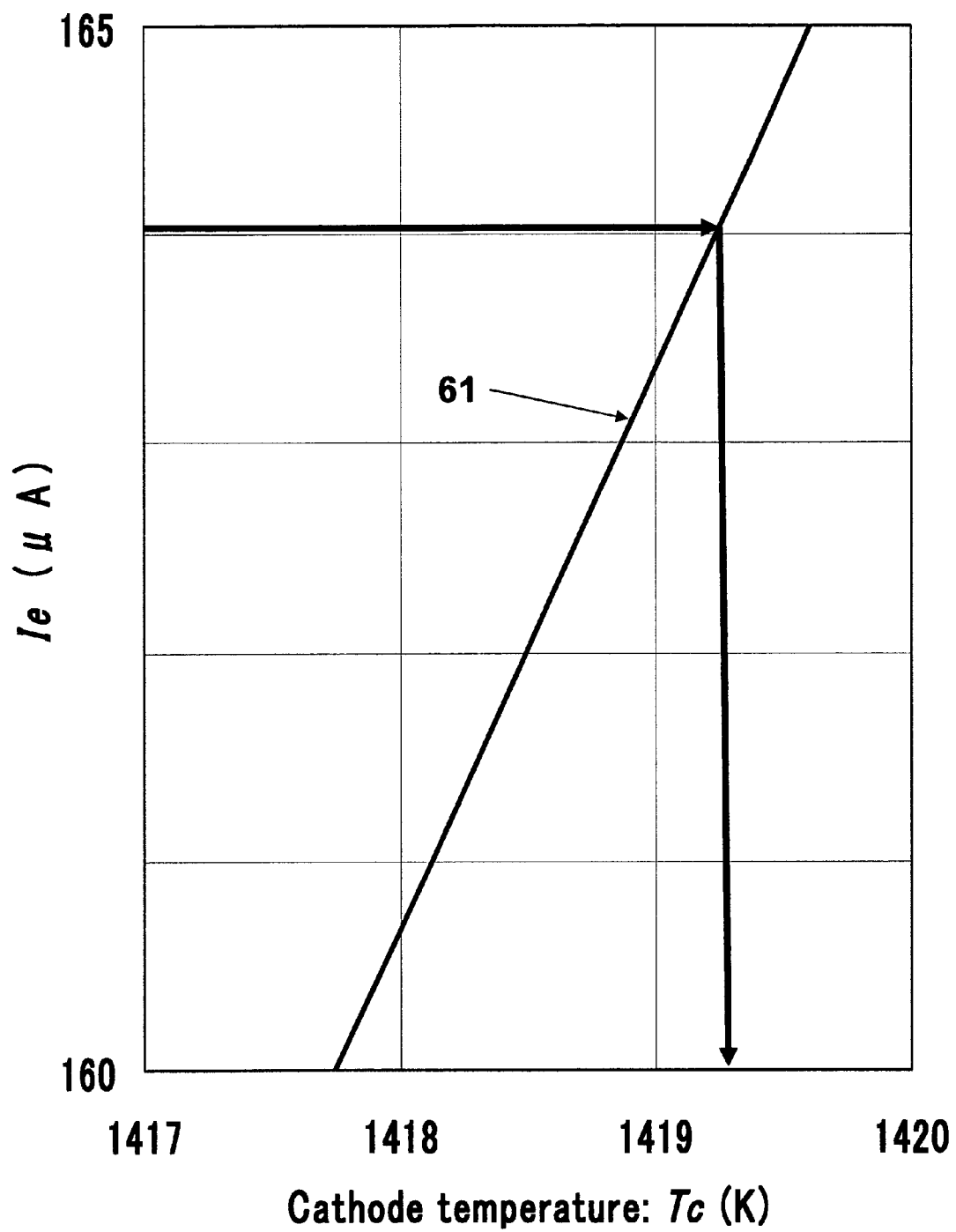
FIG. 6. Simulated emission current for defining the cathode temperature. The emission current of the 164 μA give the cathode temperature of 1419.3 K.

For these three measurements, the emission current is 164 μA and the cathode temperature which was measured previously is 1186 K. However, for the temperature and the work function of the 2.65 eV the simulated maximum emission current is only 2.19 μA, therefore the more reliable cathode temperature is studied. FIG. 6 is the measured emission current: 61 as a function of the wehnelt voltage: Vw where the cathode temperature is 1805 K, and the electron gun is operated in a space charge limited condition. The emission current is restricted not by the cathode temperature but by a source capacity for the emission current.

Firstly, the wehnelt position is defined. The broken: 52 and dotted: 53 lines are the simulated emission current for the wehnelt position of −0.1 and −0.2 mm, respectively; here the z-coordinate of the cathode apex is the 0. As seen in this figure, the broken curve is proximity to the measured emission characteristics, and then wehnelt position is defined as the −0.2 mm. Secondly, the cathode temperature is defined. FIG. 6 is the simulated emission current: 61 as a function of the cathode temperature for the model in FIG. 4, when the wehnelt position of the −0.2 mm and the wehnelt voltage of −500 V. When the wehnelt voltage is the −500 volt, the measured emission current is the 164 μA, and then the cathode temperature is defined as 1419.3 K.

For such a low cathode temperature, the crossover and an emission direction are separated as five beams and four directions, respectively, however only a central part of the beam pass through the NA aperture, because the wehnelt voltage is so shallow that the emission from the (310) and (301) orientation diverge so large angle that they do not pass through the NA aperture, fortunately. Therefore a very fine and intense beam is measured. As shown in the last column in Table-II, each acceptance is calculated as the product of the beam half angle: α and the measured beam diameter: $\phi_b$. If the Emittance of the electron gun is larger than the acceptance, the brightness calculated by the eq. (3) has no problem. However, if the Emittance is smaller than the acceptance, the NA aperture is only partially illuminated and the measured brightness is not the axial brightness but an average brightness.

The heating current is improved from the 1.9 Ampere to 2.4 Ampere, and the cathode temperature previously measured is 1604 K. The beam energy is the 10 keV and the lens condition is the same as before. For the wehnelt voltage of −670 V, the emission current varies 37, 57, and 96 μA, therefore the cathode temperature is not a stationary temperature but a transition state. The cathode temperature increases very slowly, and each the beam diameter and the beam current for these emission currents can be measured within a small cathode temperature change.

The measured pairs of the beam current: $I_b$ and the beam diameter: $\phi_b$ for the emission current of the 37, 57, and 96 μA are 0.26 nA and 666.3 nm; 0.5 nA and 675 nm; and 1 nA and 769.8 nm, respectively. The NA aperture diameter and the image position of the second lens are the 40 μm and the 13.85 mm, respectively and then the beam semi-angle: α is 1.17 mrad. The brightness is calculated as $1.7 \times 10^4$, $3.19 \times 10^4$, and $4.91 \times 10^4$ A/cm²sr, for the emission current of the 37, 57, and 96 μA, respectively. For this measurement a SEM image of the Au plated Si edge is not a single line but double lines, and the SE integrated intensity distribution for the beam diameter measurement is not an error function but two stepped waveform, unfortunately. Therefore the crossover image is separated roughly perpendicular direction to the edge, and then the beam diameter is measured as larger than the single spot and the NA aperture is only partially illuminated. Because of these two problems three brightness are measured as much lower values than the axial brightness.

Figure 8:
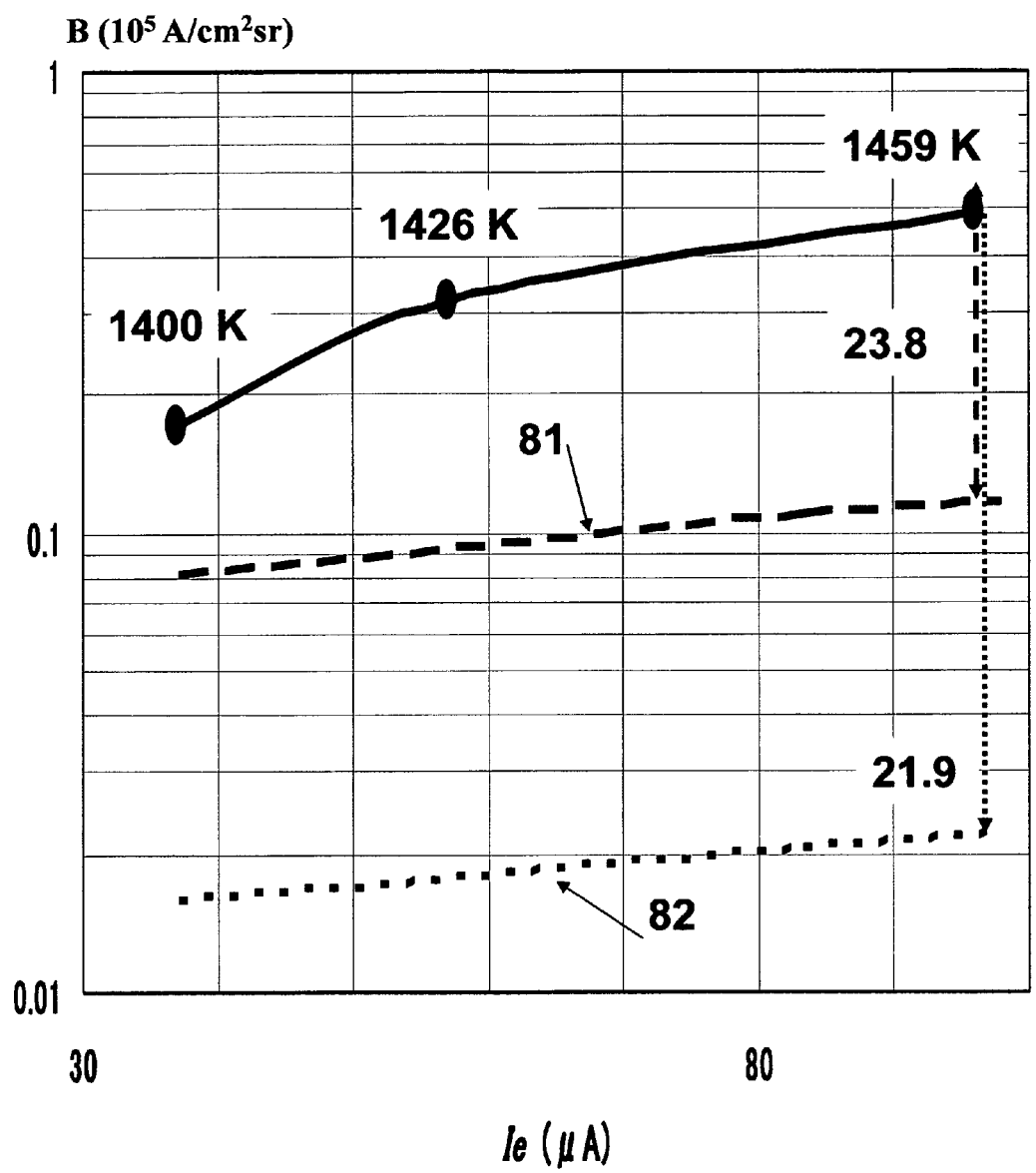
FIG. 8. Measured brightness and simulated Langmuir limit for Koehler illumination, the beam energy of the 5 keV, and the cathode temperature of the 1805K. The simulated brightness is also shown in the broken with a dot curve.

The brightness as a function of the emission current is shown in FIG. 8. Each Langmuir limit: 82 is calculated from the simulated axial cathode current density for each emission current and the cathode temperature of the 1400, 1426, and 1459 K. The measured brightness for the temperature of the 1459 K is 21.9 times higher than Langmuir limit. Where 81 is the simulated brightness×0.01.

The following measurements are done for the condition (2) that is, the Koehler illumination condition. The heating current is improved from the 2.4 Ampere to 2.6 Ampere, the previously measured cathode temperature is the 1805 K and the emission direction and the crossover for the emission current smaller than the 190 μA become an axial symmetric and a single Gaussian crossover, respectively. For the beam energy of 5 keV, the brightness measurement is done. The measured beam diameter is 1000 nm. On the one side the reduced aperture image diameter of the blanking aperture is 1088 nm, and a calculated distance between the readings corresponding to the 10% and 90% of the 1088 nm is 758 nm, for a square intensity distribution beam. The difference between the 1000 and the 758 nm are caused by an axial chromatic aberration, a space charge blur and a measuring error. Here the 1000 nm is adopted for the brightness defines.

Figure 9:
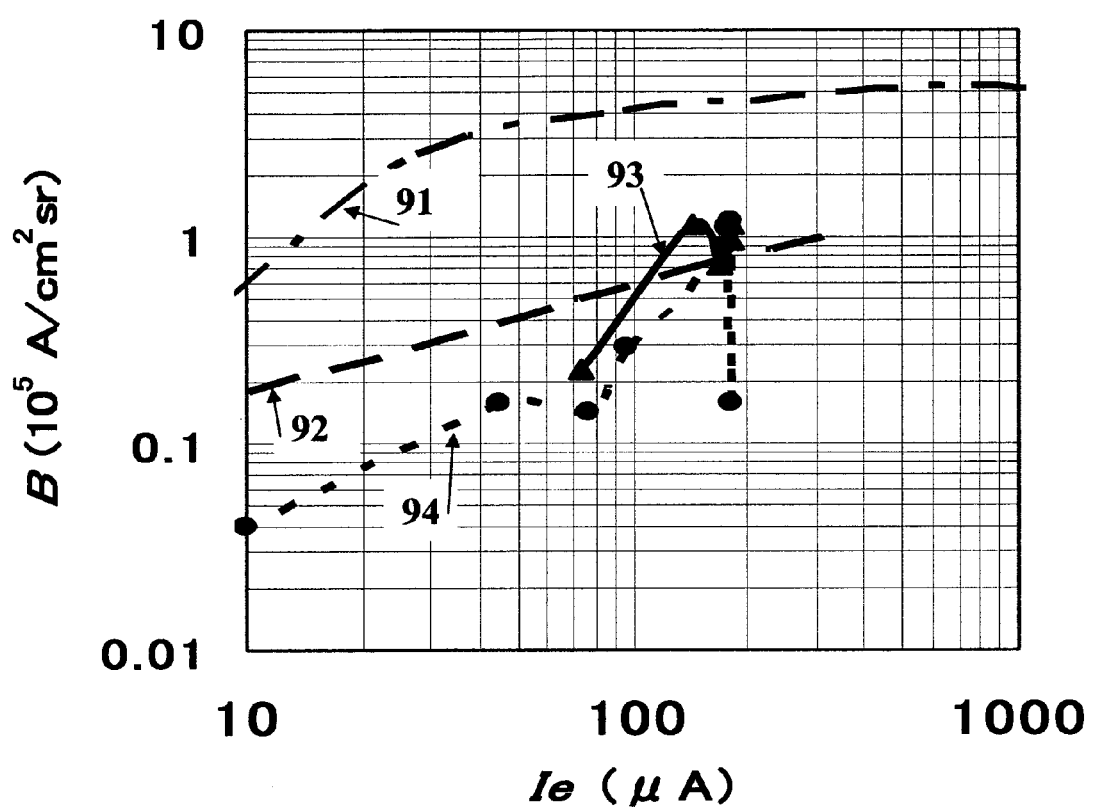
FIG. 9. Measured brightness and simulated Langmuir limit for Koehler illumination and the cathode temperature of the 1805K, where the beam energy is the 2 keV. The simulated brightness is also shown in the dotted curve.

FIG. 9 shows the brightness as a function of the emission current, and Langmuir limit: 92 which are calculated by the simulated axial cathode current density and the cathode temperature of the 1805 K. For the measurement-1: 93 and -2: 94, the electron gun alignment is done so that an absorbed current by the NA aperture and by the Faraday cage are maximized, respectively. It is seen that the electron gun alignment method give little effect to the brightness measurement. As shown in FIG. 9, five point values are higher than Langmuir limit and six point values are lower than Langmuir limit. Therefore, the measured brightness is comparable to the simulated Langmuir limit. Where 91 is the simulated brightness.

Figure 10:
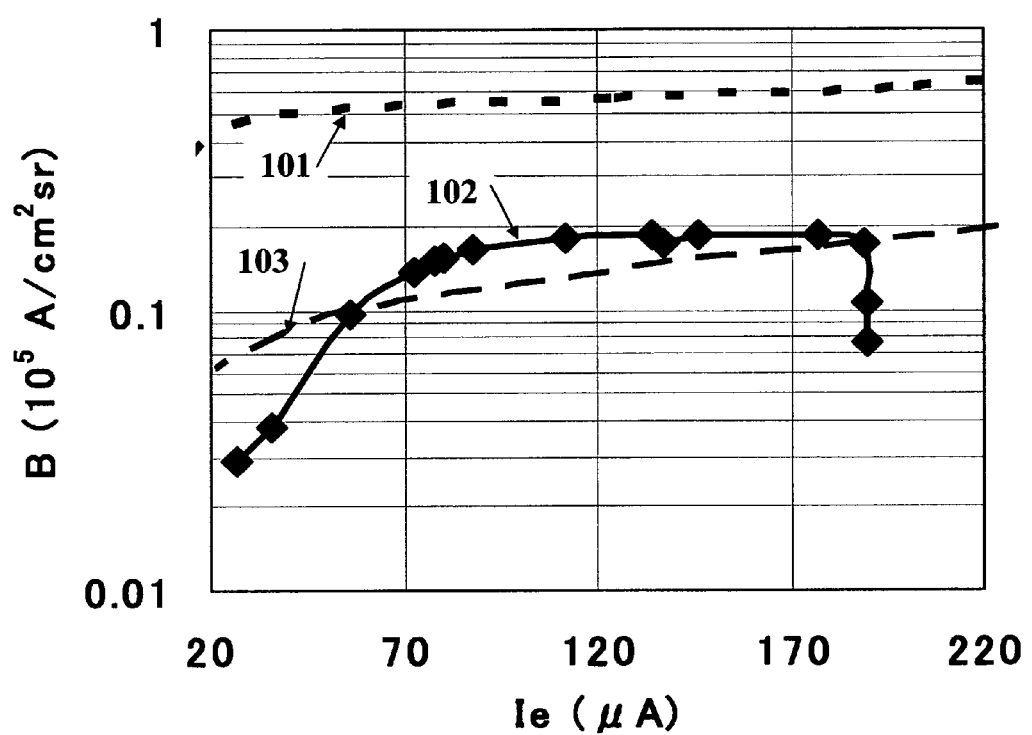
FIG. 10 The measured and simulated brightness, and Langmuir limit as a function of the image position: b. The simulated Emittance is also plotted in the dotted line. The simulated cathode temperature is the 1419.3 K and the image position: b of 10 meters is the parallel beam condition FIG. 11 Chart for defining the optimum brightness FIG. 12 Summary of the brightness measurements, the abscissa: b/a is the magnification factor of the first stage lens.

FIG. 10 is the simulated: 101, measured brightness: 102 and Langmuir limit: 103 as a function of the emission current, where the beam energy is 2 keV, the optics is Koehler illumination and the beam size is selected as the 758 nm. As seen in FIG. 10, the measured brightness is comparable to Langmuir limit. These measured brightness in FIGS. 9 and 10 are adopted as the 1000 nm and the 758 nm, respectively for the beam diameter.

(1) Measurement for the Parallel Beam Condition

Figure 7:
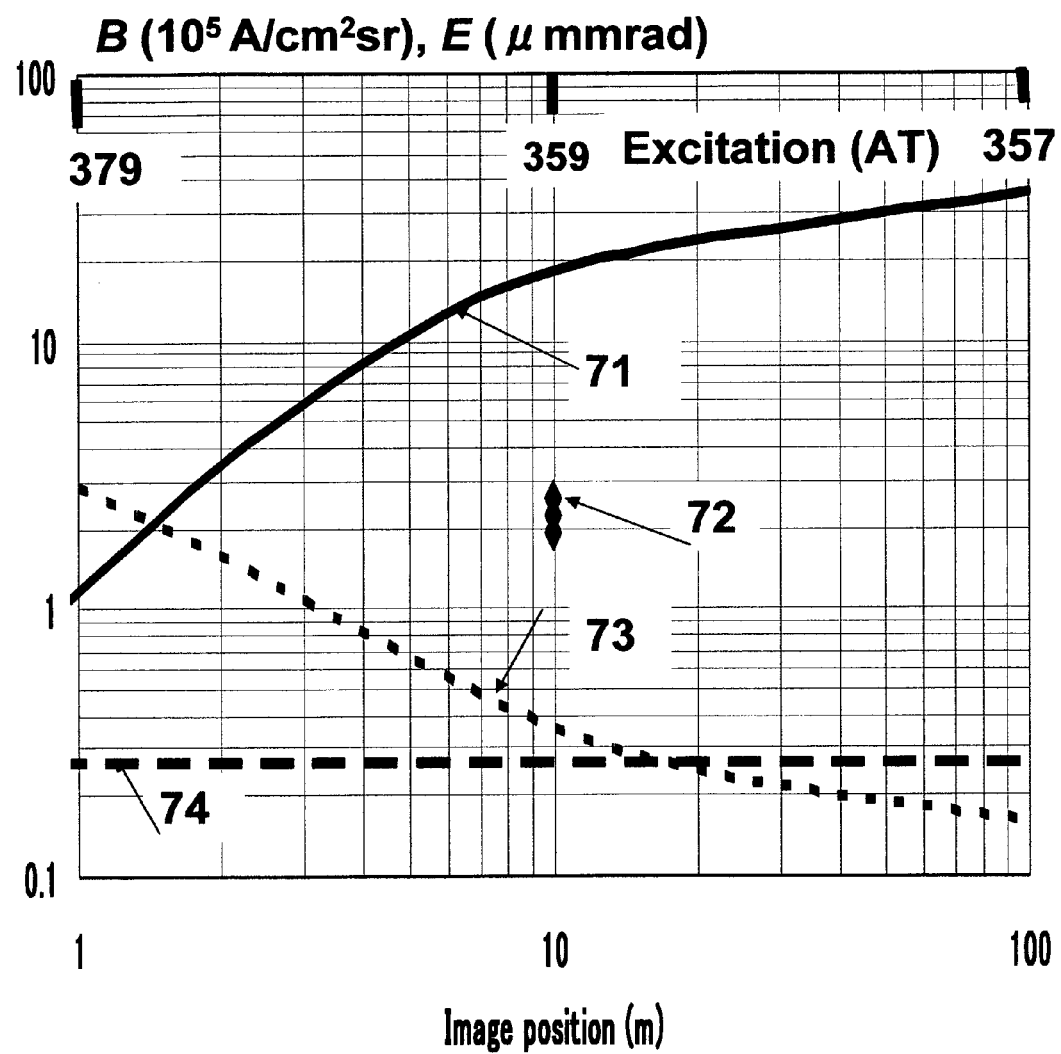
FIG. 7. The measured and simulated brightness and Langmuir limit are shown by the solid, broken and dotted curves, respectively, where the beam energy is the 10 keV and the wehnelt bias is the −670 V.

Using the cathode temperature of the 1419.3 K, the model in FIG. 4 and the magnetic lens which is designed at the 123 mm from the cathode, the brightness are simulated. The magnetic lens is a typical lens with the lens gap of 3 mm and the bore radius of 11 mm and the magnetic field is formed for the z-coordinate from −100 mm to 80 mm. Emittance is also calculated as the product of the $\phi_{co}$ and the $\theta_{90}$. The cathode current density is also simulated as 0.103 A/cm$^2$. Using this cathode current density Langmuir limit is calculated as 2.68× 10$^3$ A/cm$^2$sr. These simulated results and measured brightness in Table-II and simulated Langmuir limit as a function of the image position: b are shown in FIG. 7. The measured three brightness values: 72 are about 10 times lower than the simulated brightness; 71; however they are from 73 to 100 times higher than simulated Langmuir limit: 74. In FIG. 7, when the image position: b is 10000 mm, the simulated Emittance: 73 is 0.36 μmmrad and larger than the acceptance of No. 1:0.287, and smaller than the 0.582 and 0.41 mmrad, which are the acceptances of No. 2 and No. 3, respectively. Therefore, the measured brightness No. 1 is no problem, however the brightness No. 2 and No. 3 are lower value than the axial brightness. It can be said that the maximum measured brightness is at least 100 times higher than Langmuir limit.

In FIG. 8 the measured and simulated brightness for the heating current of the 2.4 Ampere are compared, where the simulated brightness: 81 is multiplied by 0.01. The simulated brightness: is 23.9 times higher than the measured one. This high separation ratio is the course of the crossover separation. In spite of the crossover separation problem, the measured brightness is 23 times higher than Langmuir limit: 82.

(2) Measurement for the Cathode Temperature of the 1805 K and Koehler Illumination Condition For the lens position: a of the 123 mm from the cathode, the image position b of 108 mm, the beam energy of the 5 keV and the cathode temperature of the 1805 K, the brightness: 93 and 94 and the cathode current density as a function of the emission current are simulated and added in FIG. 9. When the image position is a little smaller than the lens position, the measured brightness is comparable to the Langmuir limit: 92 and about 28% of the simulated brightness: 91.

For the beam energy of the 2 keV and the image position: b of the 108 mm the brightness and the axial cathode current density as a function of the emission current is simulated. From the beam energy of the 2 keV, the cathode temperature, and the simulated axial cathode current density, Langmuir limit is calculated and added in FIG. 10. When the image position is a little smaller than the lens position, the measured brightness is comparable to the Langmuir limit: 103 and about 20% of the simulated brightness: 101. As the beam diameter of the 758 nm instead of 1000 nm is adopted, the measured brightness are comparable to Langmuir limit and about 35% of the simulated brightness: 101.

From the FIGS. 1 and 10 it is said that all the measured brightness are higher than Langmuir limit and lower than the simulated brightness and for the electron gun with different cathode apex radius of curvatures, the greater part of the measured brightness are nearer to the simulated brightness than Langmuir limit.

From the simulated brightness and Emittance in FIG. 3 it is expected that for the brightness measurement smaller than the 1×10$^7$ A/cm$^2$sr, the Emittance is larger than 13 mmrad and sufficiently larger than the acceptance values in Table-II. However the simulation for the cathode temperature of the 1419.3 K and the image position: b of the 10000 mm, the simulated Emittance is only the 3.6 μmmrad, and comparable or smaller than the acceptance of the apparatus. Therefore, the beam half angle α must be measured not from the NA aperture size but from a measured beam diameter on the NA aperture: $\phi_{NA}$. The beam half-angle α become to the eq. (4), $$\alpha = \phi_{NA}(d+e-c)/(d-c)f. \tag{4}$$

The beam diameter $\phi_{NA}$ can be defined to be the distance between the readings corresponding to the 10% and 90% of a transmission electron integrated intensity distribution during the scanning at the edge of the NA aperture.

The brightness higher than the simulated Langmuir limit is measured using two measuring system and for the many emission conditions and for six sized cathodes. If the simulated cathode current density is near to the real value, the brightness higher than Langmuir limit is reliable, because there is few factor of measuring higher brightness than the real value.

For three lens excitation conditions, these are (1) the parallel beam condition, (2) the image position: b is larger than the lens position: a, and (3) the image position: b is a little smaller than the lens position: a, the ratios between the measured brightness and the simulated Langmuir limit are from the 73 to the 100, from the 2.4 to the 8.7, and comparable, respectively. These experimental brightness for three lens excitation conditions are consistent to the simulation that the brightness depends on the first lens excitation. From these measurements it may say that the brightness can be adjusted by changing the first lens excitation.

Figure 11:
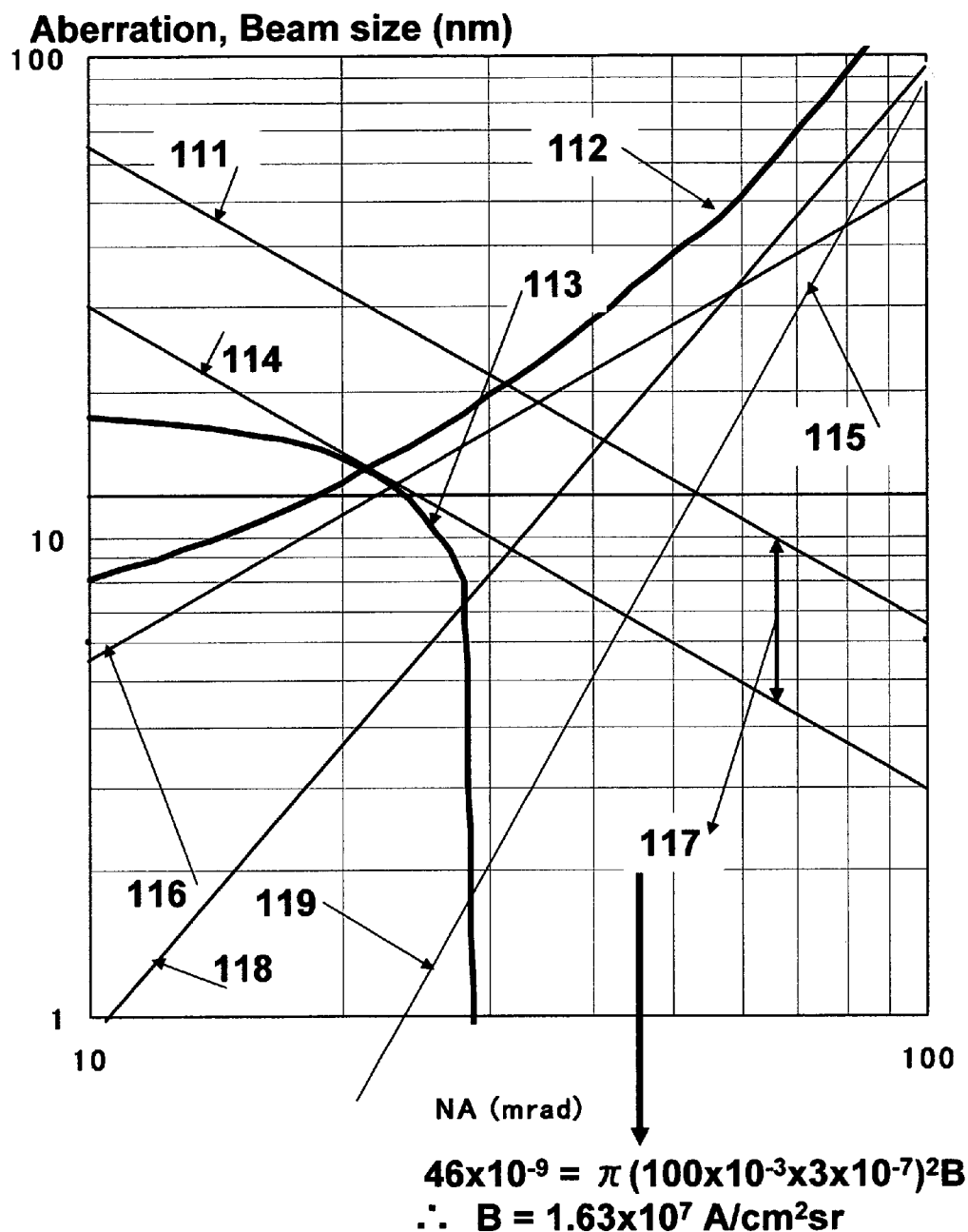

FIG. 11 is a method of defining the optimum brightness measurement method in this invention. Where 111 is the space charge effect for the beam current of 100 nA, the axial chromatic aberration: 116, a coma 118, and a spherical aberration 119 as a function of NA are added and shown 112 as a total blur. A required beam size is 20 nm and an effective beam size $D_{eff}$ is calculated as eq. 11, and shown a curve 113.

$$D_{eff} = \sqrt{(20^2 - D_{total}^2)}.$$

Line 114 is a tangent of the curve 113. From the difference between the line 111 and 114, 46 nA for the 114 is obtained. From the equation shown bottom in FIG. 11, the optimum brightness is obtained as B=1.63×10$^7$A/cm$^2$sr.

The optimum brightness can be defined from an experience.

Figure 12:
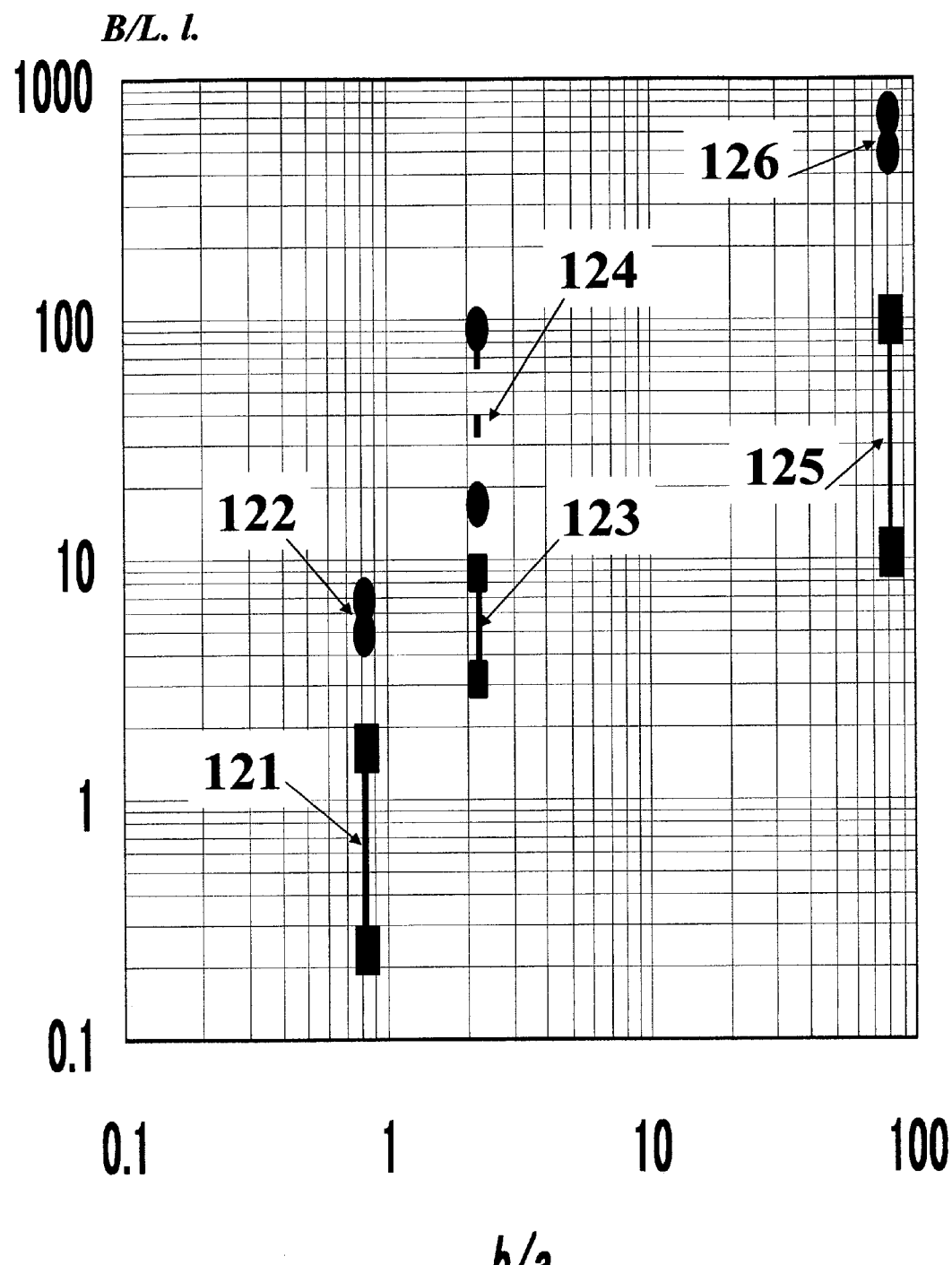
Figure 13:
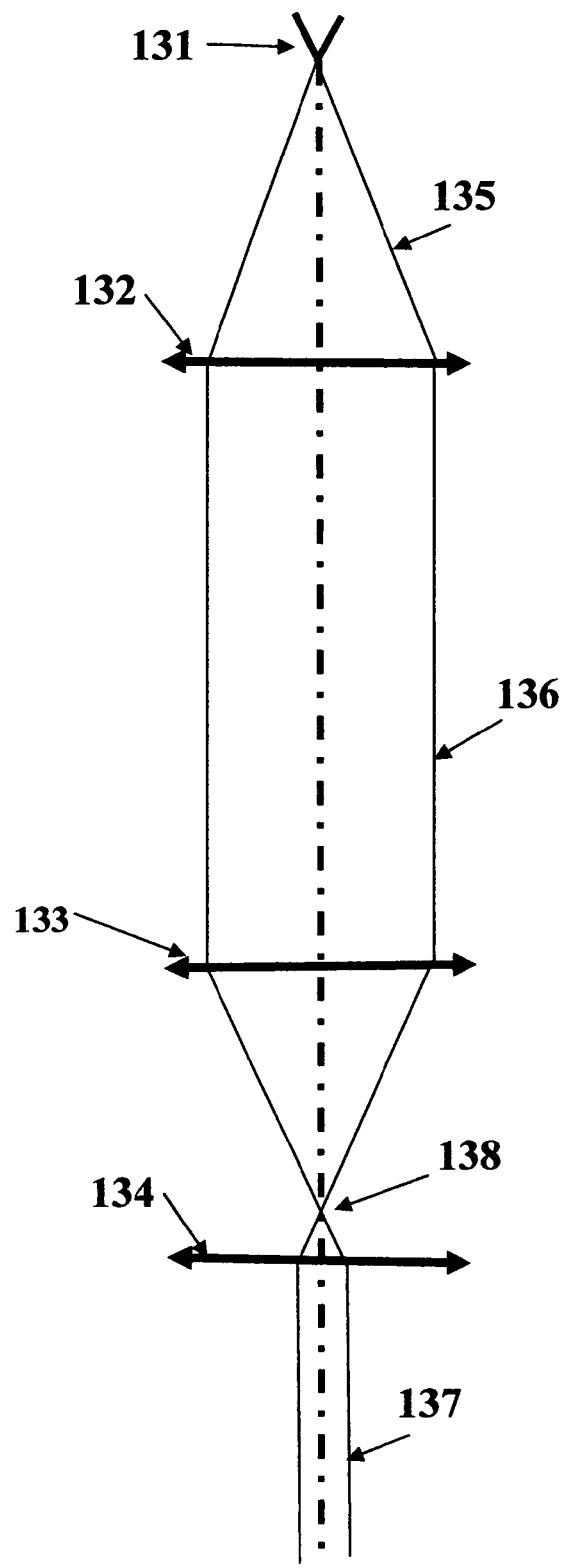
FIG. 13. Electron optics for forming a fine beam size with very small diverging angle.

FIG. 12 is a summary of the experiment. An abscissa is a ratio between the image position/lens position: b/a, and an ordinate is the ratio between the Simulated or the measured brightness/Langmuir limit. 121, 122 and 113 are for the measured brightness and 122, 124 and 126 are for the simulated brightness. The data: 122 and 124 are the data for the cathode radius of curvature of 20 μm Rcc. As see in FIG. 12. The simulated and the measured brightness depend on the image position of the first stage lens. The ratio between the image position/lens position: b/a is a magnification of the first stage lens, and therefore this figure shows that the brightness and Emittance can be controlled by adjusting the magnification factor of the first stage lens FIG. 13 is an example of the charged particles beam source for an ERL radiation optical source. The charged particles beam: 135 emitted from the charged particles beam source: 131 are condensed by the first stage lens: 132, formed parallel beam: 136, and focused by the second lens: 133, and formed a crossover: 138 before the $3^{rd}$ lens 134. The charged particles beam from the crossover: 138 is condensed by the $3^{rd}$ lens: 134 and make the parallel beam: 137. The lens position of the first lens: 132 must be larger than 41 mm, and the lens position of the $3^{rd}$ lens must be smaller than 40 mm. When the ratio: (the lens position of the first lens/the lens position of the $3^{rd}$ lens) is sufficiently larger than 1, the parallel beam 137 is very small diameter. The brightness of this beam is very high, and then the diverging angle of this beam is very small. When the image position of the second lens is smaller than the lens position of the $3^{rd}$ lens, the beam diameter of the second parallel beam is smaller than that of the first parallel beam.

Figure 14:
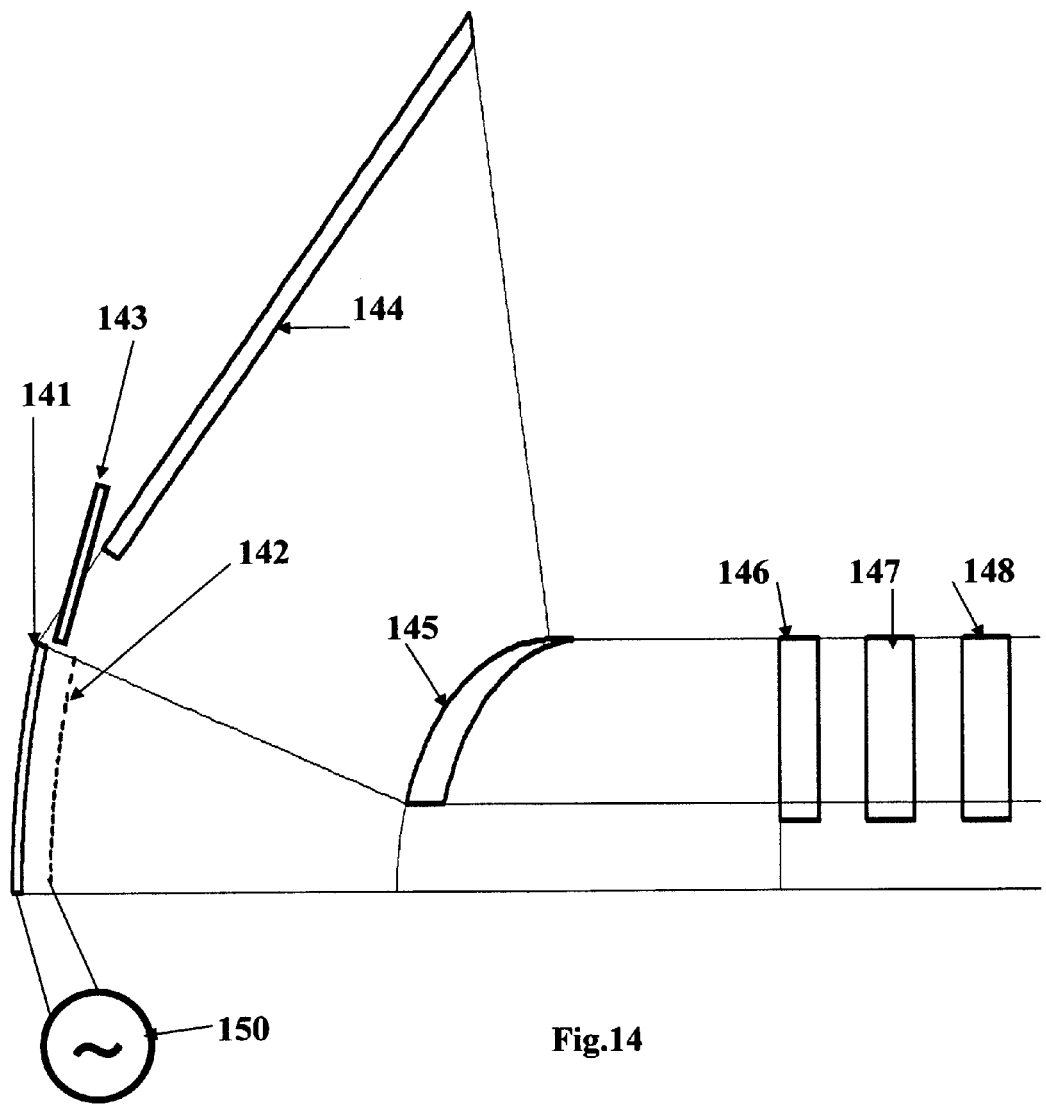
FIG. 14. An ion source of a small Emittance heavy ion.

FIG. 14 is an ion source with a small Emittance.

Between a spherical electrode: 141 and a spherical mesh electrode: 142 a high frequency electromagnetic wave is added from a high frequency generator: 150. When a gas for the heavy ion is added from a nozzle: 143, a gas discharge is occur, the ion is generated and an ion beam is drawn by a beam drawing electrode: 145. The ion beam make the crossover at a position around the beam drawing electrode. The distance between the crossover and an electro-static lens: 146, 147 and 148 is larger than 41 mm, and the lens forms the parallel beam, and then a very small Emittance ion beam is obtained. This ion beam have very small diverging angle. When the ion beam is introduced to an accelerator, the heavy ion beam with a large beam current is irradiated to cancer cell.

Though most of discussions are done regarding the electron beam, for the charged particles beam above story can be stand.

EFFECT OF THIS INVENTION

As above explained the best mode of the electron beam apparatus for this invention, this invention enable to obtain the charged particles beam apparatus which gives the brightness higher than Langmuir limit and the charged particles beam with the small energy width. Therefore, the finely focused multiple beam with large beam current are formed around an optical axis, and the SEs from the electron beam far from the optical axis can be detected easily, the emission current can be small, and then the space charge effect is small. And when the small aperture is deposited back of the anode and remove the peripheral beam, the energy width increase due to the space charge effect become small.

TABLE 1

| Data for Simulation | | | | | | | | | |
|---|---|---|---|---|---|---|---|---|---|
| | | | | | Mesh | | | | |
| Title sz.dat 30 umR | | 1 | 21 | 41 | 51 | 71 | 171 | 221 | 251 |
| 1900k | 1 | −1.5 | −2.5 | −2.1838 | −1.9838 | 2 | 12 | 17 | 20. |
| Units mm | 56 | −.4 | −.4 | −.0 | 0.2 | 2 | 12 | 17 | 20. |
| Cathode | 61 | −.237573 | −.233432 | −.0 | .2 | 2 | 12 | 17 | 20. |
| region 61 121 | 91 | −.008786 | −.005355 | .05 | .25 | 2 | 12 | 17 | 20. |
| Temperature 1900 | 121 | 0. | .02 | .08 | .3 | 2 | 12 | 17 | 20. |
| Work Function 2.65 | | 1 | 21 | 41 | 51 | 71 | 171 | 221 | 251 |
| Richardson constant 70 | 1 | 0.3 | 5. | 7.2 | 7.2 | 9. | 17. | 17. | 17. |
| Space charge on | 56 | .3 | 1. | 1.2 | 1.2 | 2. | 8.5 | 2.2 | 2.2 |
| Rays on | 61 | .25 | .3 | 1. | 1. | 1. | 2.2 | 2. | 2. |
| Cycles 30 | 91 | 0.021213 | .035355 | .1 | .2 | .5 | 1. | 1. | 1. |
| Time step factor 0.33 | 121 | 0. | 0. | 0. | 0. | 0. | 0. | 0. | 0. |
| Convergence 0.002 | | 1 | 21 | 41 | 51 | 71 | 171 | 221 | 251 |
| Magnetic lens cl1 | 1 | 0. | 0. | 0. | 0. | 0. | 0. | 0. | 0. |
| Position 123 | 56 | 0. | 0. | 0. | 0. | 0. | 0. | 0. | 0. |
| Excitation 685AT | 61 | 0. | 0. | 0. | 0. | 0. | 0. | 0. | 0. |
| | 91 | 0.03 | 0.05 | 0. | 0. | 0. | 0. | 0. | 0. |
| | 121 | 0. | 0. | 0. | 0. | 0. | 0. | 0. | 0. |
| | | 1 | 21 | 41 | 51 | 71 | 171 | 221 | 251 |
| | 1 | 0. | 0. | 0. | 0. | 0. | 0. | 0. | 0. |
| | 56 | 0. | 0. | 0. | 0. | 0. | 0. | 0. | 0. |
| | 61 | 0. | 0. | 0. | 0. | 0. | 0. | 0. | 0. |
| | 91 | 0. | 0. | 0. | 0. | 0. | 0. | 0. | 0. |
| | 121 | 0. | 0. | 0. | 0. | 0. | 0. | 0. | 0. |
| Relativity on | | 41 | 51 | 1 | | 61 | | −870 | |
| Save trajectories on | | 171 | 221 | 1 | | 56 | | 20000. | |
| Rotational Symmetry | | 221 | 241 | 1 | | 56 | | 20000.00 | |
| sz.con | | 1 | 0. | | | | | | |
| Time step factor 0.3 | | 121 | 0. | | | | | | |
| Rays 249 | | 1 | 0. | | | | | | |
| | | 41 | | | | −870 | | | |
| | | 51 | | | | −870 | | | |
| | | 171 | 20000.00 | | | | | | |
| | | 251 | 20000. | | | | | | |
| | | 1 | 20000.00 | | | | | | |
| | | 121 | 20000.00 | | | | | | |

The invention claimed is:

1. A charged particles beam apparatus consisting of a charged particle beam source, a beam drawing electrode, and a beam control electrode, wherein;
    after the charged particles beam source a condenser lens is designed, and brightness of the charged particles beam is adjusted by adjusting a magnification factor of said condenser lens.

2. The charged particles beam apparatus of claim 1, wherein,
    said magnification factor of said condenser lens is infinite.

3. The charged particles beam apparatus of claim 1, wherein,
    said brightness is adjusted by a distance between the lens principal plane and the image of the condenser lens.

4. The charged particles beam apparatus of claim 1, wherein,
    a distance between the beam source and the lens principal plane of said condenser lens is larger than 41 mm.

5. The charged particles beam apparatus of claim 1, wherein,
    further comprising a second condenser lens, and the distance between the crossover and the second condenser lens is smaller than 40 mm.

6. The charged particles beam apparatus of claim 1, wherein,
    further comprising a second and third condenser lenses, a first parallel beam is formed by said first lens, and the second parallel beam is formed by said third condenser lens, and wherein the second parallel beam size is smaller than the first parallel beam.

7. The charged particles beam apparatus of claim 1, wherein,
    said optimum brightness is estimated from the emittance.

8. The charged particles beam apparatus of claim 1, wherein,
    an aperture is deposited back of the anode and removes the peripheral beam.

9. The charged particles beam apparatus of claim 1, wherein,
    said magnification factor is larger than 1.

10. The charged particles beam apparatus of claim 1, wherein said charged particles beam is an ion beam.

11. The charged particles beam apparatus of claim 1, wherein
    said charged particles beam source have a spherical electrode and a spherical mesh electrode.

12. A charged particles beam apparatus consisting of a charged particle source, a beam drawing electrode, a beam control electrode, and a condenser lens wherein;
    after the charged particles beam source the condenser lens is designed, and an emittance of the charged particles beam is adjusted by adjusting a magnification factor of the condenser lens.

13. The charged particles beam apparatus of claim 12, wherein, said magnification factor of the condenser lens is smaller than 1.

14. A charged particles beam apparatus design method comprising steps,
    after the charged particles beam source a condenser lens is deposited,
    the optimum brightness is estimated, and
    the brightness is adjusted to said optimum brightness by adjusting a magnification factor of said condenser lens.

15. The charged particles beam apparatus design method in claim 14,
    said optimum brightness is estimated by aberrations of the lens system, a space charge effect or diffraction and required beam characteristics.

16. The charged particles beam apparatus design method in claim 14,
    said required beam characteristics is a beam size.

17. The charged particles beam apparatus design method in claim 14,
    said beam characteristics is a beam diversion angle.

18. The charged particles beam apparatus design method in claim 14, further comprising a step
    the brightness as a function of the distance between the lens principal plane and the image of the condenser lens is simulated.

19. The charged particles beam apparatus design method in claim 14, further comprising a step,
    the second and $3^{rd}$ lens is designed, and the distance between the crossover and the second or the $3^{rd}$ lens is smaller than 40 mm.

20. The charged particles beam apparatus design method in claim 14,
    said optimum brightness is estimated from an experience.

* * * * *